(12) United States Patent
Dong et al.

(10) Patent No.: US 7,265,015 B2
(45) Date of Patent: Sep. 4, 2007

(54) USE OF CHLORINE TO FABRICATE TRENCH DIELECTRIC IN INTEGRATED CIRCUITS

(75) Inventors: Zhong Dong, San Jose, CA (US); Tai-Peng Lee, Milpitas, CA (US)

(73) Assignee: ProMOS Technologies Inc., Hsin-Chu (TW)

( * ) Notice: Subject to any disclaimer, the term of this patent is extended or adjusted under 35 U.S.C. 154(b) by 142 days.

(21) Appl. No.: 11/174,081

(22) Filed: Jun. 30, 2005

(65) Prior Publication Data
US 2007/0004136 A1    Jan. 4, 2007

(51) Int. Cl.
*H01L 21/8238* (2006.01)
*H01L 21/336* (2006.01)
*H01L 29/76* (2006.01)

(52) U.S. Cl. .............................. 438/257; 257/E29.152; 257/E21.422; 257/E21.682

(58) Field of Classification Search ................. 438/257
See application file for complete search history.

(56) References Cited

U.S. PATENT DOCUMENTS

| | | | |
|---|---|---|---|
| 6,265,292 B1 | 7/2001 | Parat et al. | |
| 6,274,442 B1 * | 8/2001 | Gardner et al. | 438/287 |
| 6,455,389 B1 * | 9/2002 | Huang et al. | 438/305 |
| 6,562,713 B1 * | 5/2003 | Belyansky et al. | 438/631 |
| 6,956,237 B2 * | 10/2005 | Oh et al. | 257/72 |
| 7,001,844 B2 * | 2/2006 | Chakravarti et al. | 438/680 |
| 7,005,714 B2 * | 2/2006 | Ozawa et al. | 257/390 |
| 7,199,063 B2 * | 4/2007 | Lin | 438/765 |
| 2004/0014269 A1 | 1/2004 | Kim et al. | |
| 2007/0034876 A1 * | 2/2007 | Yamazaki et al. | 257/66 |

FOREIGN PATENT DOCUMENTS

WO    WO 01/47010    6/2001

OTHER PUBLICATIONS

Navi, Mitra; Dunham, Scott T. "Oxidation of Silicon in TCA/$O_2$ Ambients" Electrical, Computer and Systems Engineering Department, Boston University, Boston, MA 02215, pp. 1-10.

* cited by examiner

*Primary Examiner*—Walter Lindsay, Jr.
*Assistant Examiner*—Thu-Huong Dinh
(74) *Attorney, Agent, or Firm*—Michael Shenker; MacPherson Kwok Chen & Heid LLP

(57) ABSTRACT

Chlorine is incorporated into pad oxide (110) formed on a silicon substrate (120) before the etch of substrate isolation trenches (134). The chlorine enhances the rounding of the top corners (140C) of the trenches when a silicon oxide liner (150.1) is thermally grown on the trench surfaces. A second silicon oxide liner (150.2) incorporating chlorine is deposited by CVD over the first liner (150.1), and then a third liner (150.3) is thermally grown. The chlorine concentration in the second liner (150.2) and the thickness of the three liners (150.1, 150.2, 150.3) are controlled to improve the corner rounding without consuming too much of the active areas (140).

20 Claims, 4 Drawing Sheets

USE OF CHLORINE TO FABRICATE TRENCH DIELECTRIC IN INTEGRATED CIRCUITS

BACKGROUND OF THE INVENTION

The present invention relates to integrated circuits, and more particularly to dielectric formed in trenches in a silicon substrate. Some embodiments are suitable for substrate isolation for integrated circuits.

FIG. 1 illustrates an intermediate structure in a flash memory fabrication process using shallow trench isolation (ST1). Silicon dioxide 110 ("pad oxide") is thermally grown on silicon substrate 120. Silicon nitride 130 is formed on oxide 110 and patterned photolithographically to define substrate isolation trenches 134 to be formed between active areas 140. Oxide 110 and substrate 140 are etched through the openings in nitride 130 to form the isolation trenches. Silicon dioxide 150 is deposited to fill the trenches and cover the wafer. Oxide 150 is polished by chemical mechanical polishing (CMP) until the top surface of nitride 130 is exposed. A planar top wafer surface is provided.

Oxide 150 can be etched down (FIG. 2) to achieve a more planar topography in subsequent steps. Nitride 130 and pad oxide 110 are etched away (FIG. 3). Silicon dioxide 410 ("tunnel oxide") is thermally grown to a desired thickness (e.g. 9 nm). A doped polysilicon layer 510 (FIG. 5) is deposited on oxide layers 410, 150 to provide the floating gates and is partially patterned. Dielectric 520 (e.g. a sandwich of silicon dioxide, silicon nitride, silicon dioxide, i.e. ONO) is formed over the structure. Doped polysilicon 530 is deposited on ONO 520. Layers 530, 520, 510 are patterned together to create wordlines form the layer 530 and to finish the patterning of the floating gate. Source/drain regions 610 (top view in FIG. 6) are formed on each side of each floating gate. The cross sectional plane of FIG. 5 is marked V-V in FIG. 6. Floating gates 510 are shown with crosses in FIG. 6. Additional layers (not shown) are deposited and patterned to provide conductive bitlines contacting some of the source/drain regions. See e.g. U.S. Pat. No. 6,265,292 issued Jul. 24, 2001 to Parat et al. and incorporated herein by reference.

The electric field is undesirably increased at sharp corners 140C (FIGS. 4, 5) during the circuit operation. In addition, the growth of tunnel oxide 410 (FIG. 4) is retarded at these corners, so oxide 410 is thinner at the corners than in the middle of the active areas. The oxide thinning further increases the electric field at the corners, creating overerase and/or other problems (depending on the memory operation). See U.S. patent application published as no. US 2004/0014269 on Jan. 22, 2004, incorporated herein by reference. It is desirable to round the trench corners 410C to provide a uniform thickness oxide 410 and reduce the electric field at the corners, as illustrated in FIG. 7 (showing the wafer with rounded corners 410C at the stage of FIG. 1) and in FIG. 8 (the wafer with rounded corners at the stage of FIG. 3).

To round the corners 140C, oxide 150 can be formed by first growing a thin silicon dioxide liner on the trench surface by thermal oxidation. The oxidation rounds the corners 140C. Then the rest of oxide 150 can be deposited (by a high density plasma process, i.e. HDP, or some other technique). The rounding should be controlled to minimize the active area consumption. If the corners are at the [111] crystallographic plane and the trench sidewalls are at [100], a chlorine source can be used in the liner formation to provide a desired rounding without an undue consumption of the active area. See PCT application published as WO 01/47010 on 28 Jun. 2001 and incorporated herein by reference.

Improved corner rounding techniques for flash memories and other integrated circuits are desirable.

SUMMARY

This section summarizes some features of the invention. Other features are described in the subsequent sections. The invention is defined by the appended claims which are incorporated into this section by reference.

Some embodiments of the present invention incorporate chlorine into pad oxide 110. It is well known that chlorine increases oxygen diffusion through silicon dioxide. Chlorine has also been used in silicon dioxide layers, at a concentration of at most three atomic percent, to immobilize metal atoms. In some embodiments of the present invention, chlorine incorporation into pad oxide 110 increases the oxygen diffusion through oxide 110 during the liner formation. This oxygen diffusion increases the oxidation rate at corners 410C relative to the trench sidewalls, to create a desired rounded corner profile.

In some embodiments, the chlorine concentration in oxide 110 is more than three atomic percent. An exemplary range is 5~15 atomic percent. Greater concentrations can also be used. Some embodiments use 5~10 atomic percent of chlorine.

In some embodiments, the oxidation time is shortened to prevent undue consumption of the active area. Hence the liner is very thin (3~10 nm in some embodiments). After the liner formation, a second oxide liner is deposited by chemical vapor deposition (CVD), and then a third liner is thermally grown. The CVD liner protects the active areas from excessive oxidation when the third liner is being formed, but the corner rounding can be enhanced during the third liner fabrication. In some embodiments, chlorine is incorporated into the CVD liner to speed up oxidation of the trench sidewall and bottom surfaces during the third liner fabrication and provide a desired corner profile. The CVD liner can be used with or without chlorine incorporation into pad oxide 110.

The invention is not limited to the features and advantages described above. The invention includes non-memory integrated circuits. The corner rounding techniques can be used with trenches other than ST1 trenches, and the invention is not limited to substrate isolation. Other features are described below. The invention is defined by the appended claims.

DESCRIPTION OF SOME EMBODIMENTS

The embodiments described in this section illustrate but do not limit the invention. The invention is not limited to particular fabrication techniques or numerical values and ranges. The invention is defined by the appended claims.

Figure 9:
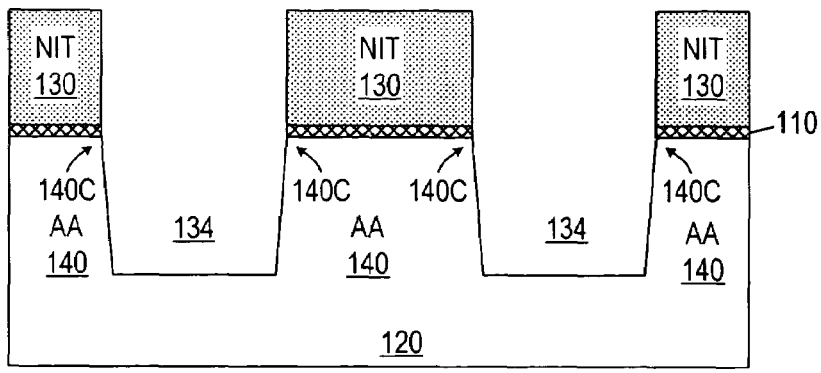
FIGS. 9-14 show cross sections of integrated circuits in the process of fabrication according to some embodiments of the present invention.

FIG. 9 illustrates initial ST1 fabrication stages in one embodiment of the present invention. Silicon dioxide layer 110 comprising chlorine atoms is formed on silicon wafer 120. In some embodiments, the chlorine concentration is more than three atomic percent, or at least 5 atomic percent. A range from 5 to 15 atomic percent is believed to be suitable, and other concentrations are possible.

In one embodiment, oxide 110 is formed by thermal oxidation at 800~1000° C. The oxygen flow is 10±5 l/min (liters per minute). The chlorine is provided by hydrogen chloride (HCl) flown at 1 l/min. Other possible chlorine sources include the chlorine gas (Cl), TCA (trichloroethane, $C_2H_3Cl_3$), TCE (trichloroethylene, $C_2HCl_2$), dichloroethylene ($C_2H_2Cl_2$). Other chlorine sources, known or to be invented, may also be suitable.

Oxide 110 can also be formed by CVD. For example, dichlorosilane can be used:

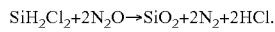

$$SiH_2Cl_2 + 2N_2O \rightarrow SiO_2 + 2N_2 + 2HCl.$$

Oxygen is also flown in the reaction chamber, reacting with the hydrogen chloride (HCl) to form chlorine. Chlorine is incorporated into the $SiO_2$ layer 110. Other fabrication techniques, known or to be invented, can also be used. An exemplary thickness of oxide 110 is 5~15 mm, but this is not limiting.

Silicon nitride 130 is formed on oxide 110 by known techniques (e.g. CVD). An exemplary thickness of nitride 130 is 100~200 nm, but this is not limiting.

A photoresist mask (not shown) is formed on nitride 130 and patterned to have openings over the positions of ST1 trenches 134. Nitride 130 is etched through the openings to form a hard mask for the ST1 trenches. Oxide 110 and silicon 120 are etched through the openings in nitride 130 to form the trenches between active areas 140. In some embodiments, the trench depth is 0.3 µm. In some embodiments, the trenches have sharp corners 140C, but this is not necessary. Smoother corners can be obtained by suitably controlling the etch process, as described for example in U.S. patent application publication US 2004/0014269 A1 published Jan. 22, 2004 and incorporated herein by reference. The etch can be anisotropic (e.g. RIE). The silicon substrate etch can be controlled to provide vertical or sloped sidewalls for the trenches. In some embodiments, the trench sidewalls are at 60~89° to the horizontal. See the aforementioned U.S. publication 2004/0014269 A1 and U.S. Pat. No. 6,265,292.

Figure 10:
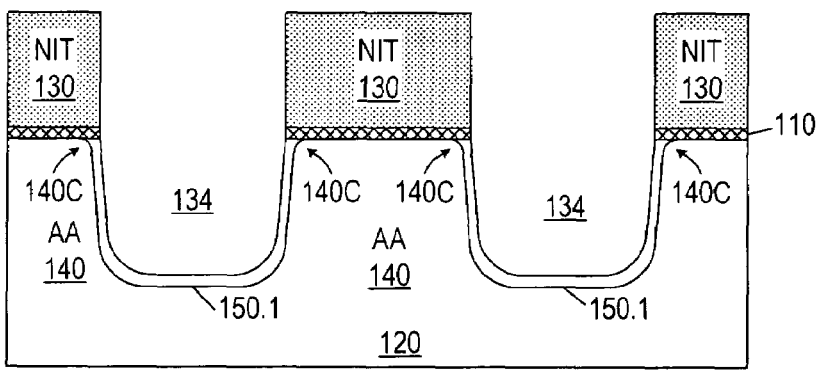

The wafer is oxidized to form a silicon dioxide liner 150.1 (FIG. 10) on the trenches' silicon surfaces. In some embodiments, the liner is formed by dry oxidation at 850~1050° C. Other oxidation processes can also be used. Oxygen diffuses through the exposed sidewalls of pad oxide 110 to round the top trench corners 140C. The bottom corners also become a little rounded.

In some embodiments, the oxidation is shortened to avoid undue consumption of active areas 140. This is particularly desirable if the active areas are narrow. In some embodiments, the active area width is 0.065~0.18 µm, and smaller widths are also possible. The liner 150.1 is only 3~10 nm thick in some embodiments.

Figure 11:
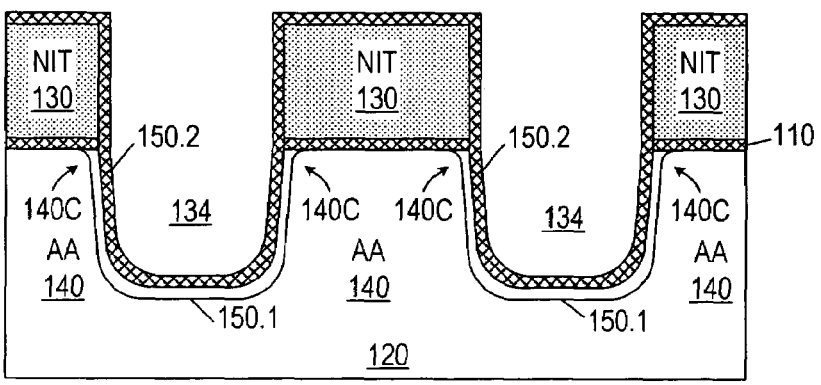
Figure 14:
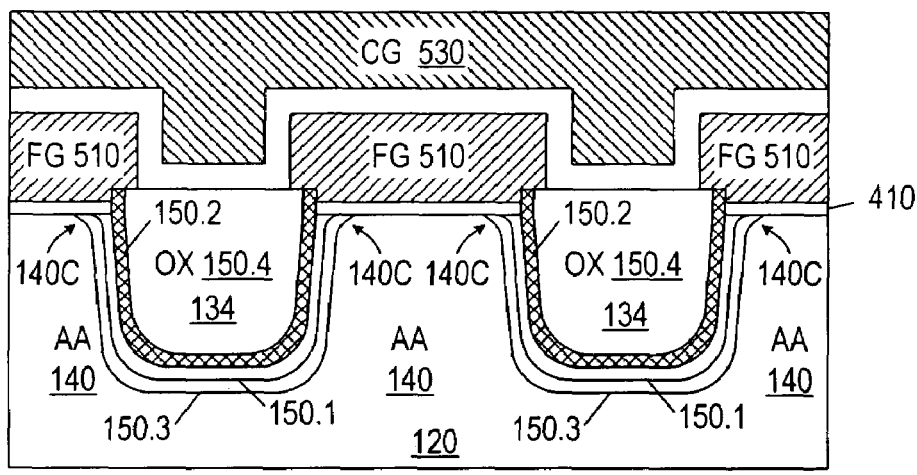

In some embodiments, additional thermal oxide is desirable to provide better isolation and more rounding of the top and bottom corners of the trenches. Before growing the additional thermal oxide however, a silicon dioxide liner 150.2 (FIG. 11) is formed by CVD on the wafer to protect the active areas. In some embodiments, layer 150.2 incorporates chlorine for control of the top corner profile during the subsequent thermal oxidation. An exemplary thickness of layer 150.2 is 3~20 nm, and the chlorine concentration is $10^{13}$~$10^{14}$ atoms/cm$^2$, or 1~10 atomic percent. Other thickness and concentration parameters and also possible, and can be selected experimentally to obtain a desired profile for top corners 140C and a desired thickness uniformity for subsequently grown tunnel oxide 410 (FIG. 14).

Figure 12:
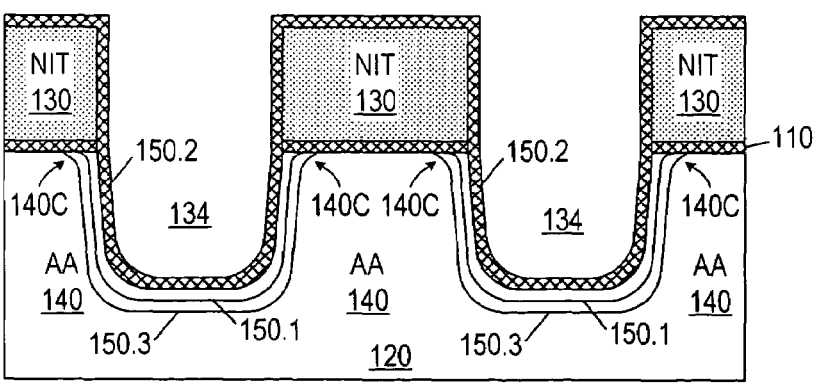

The wafer is oxidized to grow the additional thermal silicon dioxide layer 150.3 (FIG. 12) on the trench surface. In some embodiments, a low oxidation rate is achieved by diluting oxygen in nitrogen or argon to a volume concentration of 10%. The oxidation temperature is 900~1050° C. The thickness of layer 150.3 is 1~5 nm. Other processes are also possible.

In each case, the appropriate values for the thickness of layers 110, 150.1, 150.2, 150.3 and the chlorine concentration in layers 110, 150.2 may depend on the trench and active area dimensions, the fabrication equipment, and desired circuit characteristics. In each case, the appropriate thicknesses and chlorine concentrations can be determined experimentally to obtain the desired corner rounding and thickness uniformity for oxide 410 (FIG. 14).

Figure 1:
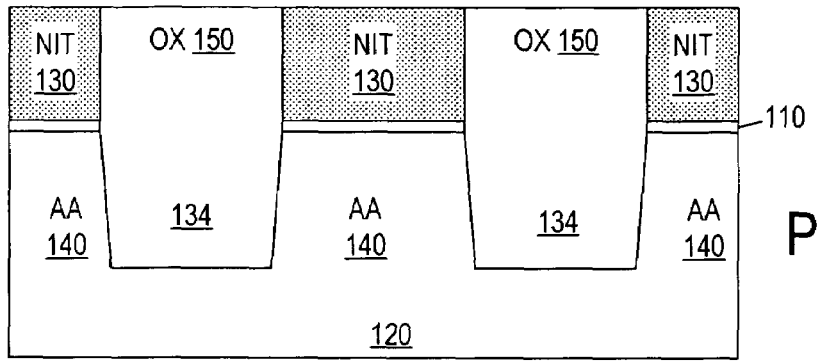
FIGS. 1-5 show cross sections of prior art integrated circuits in the process of fabrication.
Figure 2:
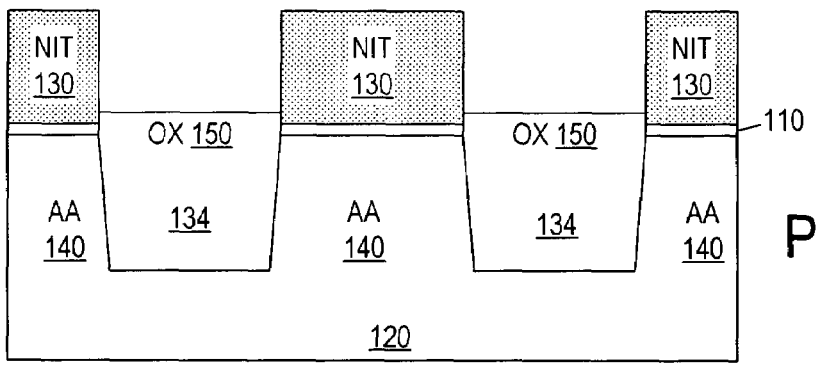
Figure 3:
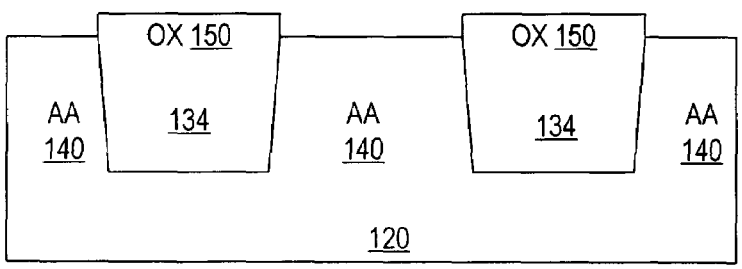
Figure 4:
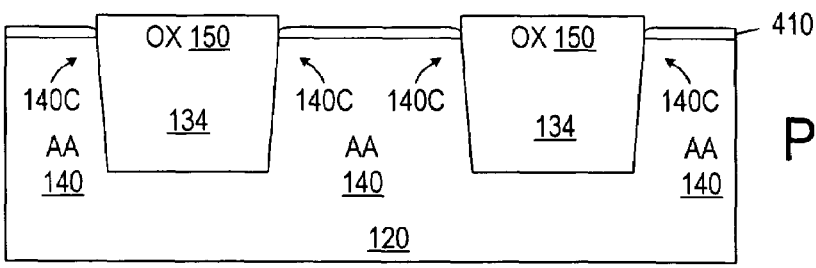
Figure 5:
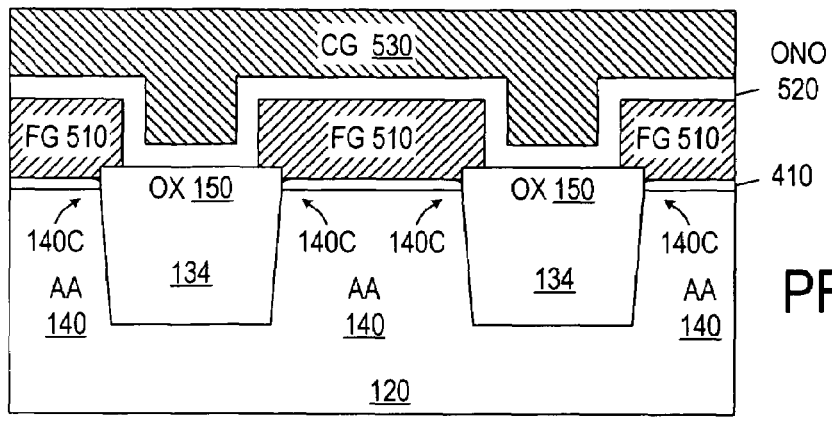
Figure 6:
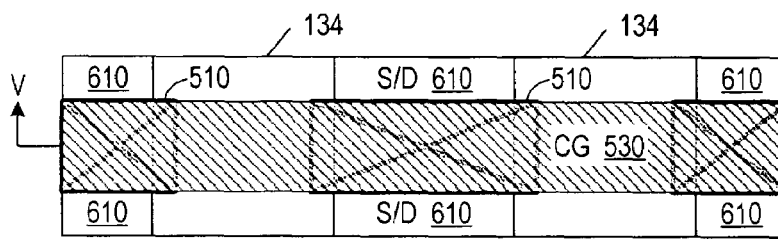
FIG. 6 is a plan view of a prior art integrated circuit in the process of fabrication.
Figure 7:
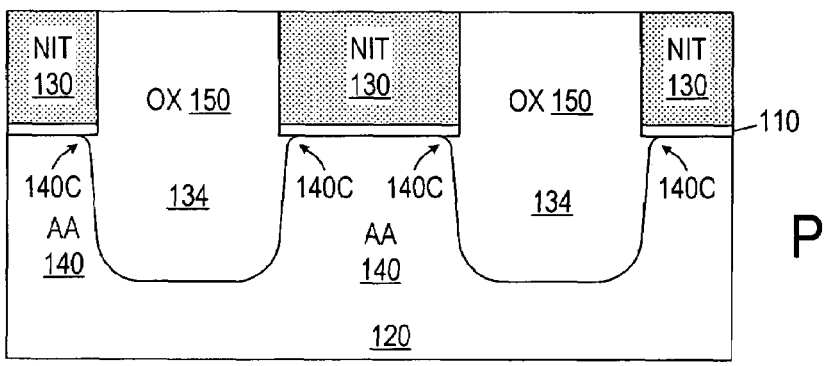
FIGS. 7, 8 show cross sections of prior art integrated circuits in the process of fabrication.
Figure 8:
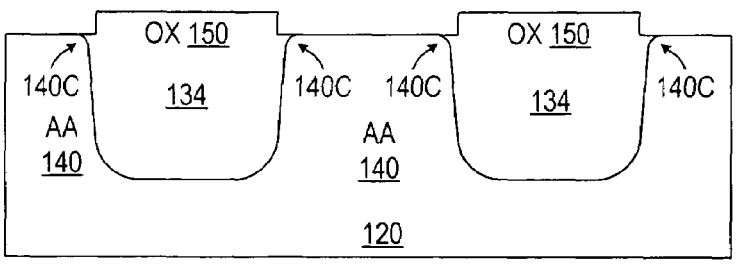
Figure 13:
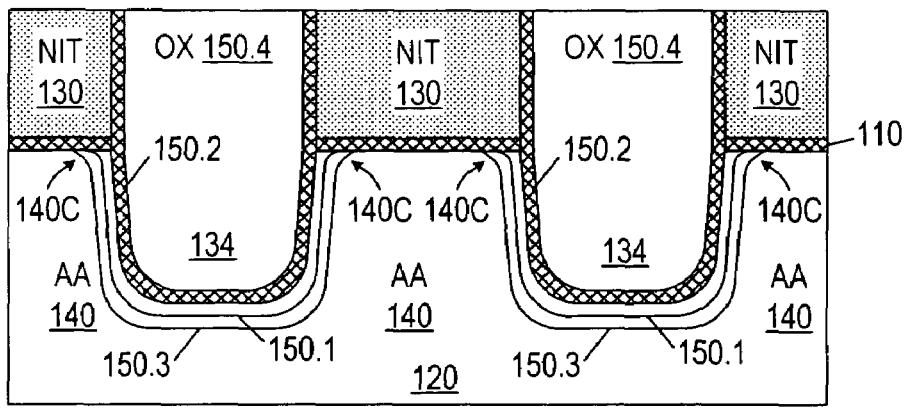

The remaining fabrication processes can be conventional. In one embodiment, silicon dioxide 150.4 (FIG. 13) is deposited by HDP to fill the trenches and cover the wafer. Oxide layers 150.4, 150.2 are polished by CMP to expose the nitride 130. Oxide 150.4, 150.2 is etched down (as in FIG. 2). Nitride 130 and pad oxide 110 are removed. Tunnel oxide 410 (FIG. 14) is thermally grown to a desired thickness. Layers 510, 520, 530 are deposited and patterned as described above, and the doping steps are performed, to form the structure of FIG. 6.

The invention is not limited to the embodiments described above. The invention is not limited to nonvolatile memories, MOS circuits, or substrate isolation. Other embodiments and variations are within the scope of the invention, as defined by the appended claims.

The invention claimed is:

1. A method for fabricating an integrated circuit, the method comprising:
   (a) forming a silicon oxide layer S1 on a silicon substrate, the silicon oxide layer S1 comprising more than three atomic percent of chlorine;
   (b) removing a first portion of the silicon oxide layer S1 and an underlying portion of the silicon substrate, to form a trench in the silicon substrate;
   (c) forming a first dielectric in the trench, wherein forming the first dielectric comprises oxidizing the silicon substrate to form a silicon oxide layer ST1 on a surface of the trench while a second portion of the silicon oxide layer S1 covers a portion of the substrate adjacent to the trench.

2. The method of claim 1 wherein the layer S1 comprises at least five atomic percent of chlorine.

3. The method of claim 2 wherein the layer S1 comprises at most 15 atomic percent of chlorine.

4. The method of claim 2 wherein the layer S1 comprises at most 10 atomic percent of chlorine.

5. The method of claim 1 wherein forming the first dielectric further comprises forming a silicon oxide layer STC1 incorporating chlorine over the layer ST1.

6. The method of claim 5 wherein forming the first dielectric further comprises oxidizing the silicon substrate after forming the layer STC1 to form additional silicon oxide on the trench's portion overlain by the layer STC1.

7. The method of claim 5 wherein the layer STC1 comprises at least one atomic percent of chlorine.

8. The method of claim 7 wherein the layer STC1 comprises at most 10 atomic percent of chlorine.

9. The method of claim 5 wherein the layer STC1 comprises at least $10^{13}$ chlorine atoms per cm$^2$.

10. The method of claim 9 wherein the layer STC1 comprises at most $10^{14}$ chlorine atoms per cm$^2$.

11. The method of claim 1 further comprising, before the operation (b), forming a first layer on the silicon oxide layer S1 and forming an opening in the first layer, wherein the operation (b) comprises etching the layer S1 and the silicon substrate through said opening, and in the operation (c) the oxidizing operation is performed when the first layer overlies said portion of the substrate adjacent to the trench.

12. The method of claim 1 further comprising, after the operation (c):
   removing the silicon oxide layer S1 from over said portion of the substrate adjacent to the trench;
   forming a gate dielectric on said portion of the substrate adjacent to the trench, wherein forming the gate dielectric comprises oxidizing a top surface of said portion of the substrate adjacent to the trench;
   forming a transistor gate on the gate dielectric.

13. A method for fabricating an integrated circuit, the method comprising:
   forming a trench in a semiconductor substrate;
   forming a first dielectric in the trench, wherein forming the first dielectric comprises:
   oxidizing the silicon substrate to form a silicon oxide layer ST1 on a surface of the trench; and
   forming a silicon oxide layer STC1 incorporating chlorine over the layer ST1.

14. The method of claim 13 wherein forming the first dielectric further comprises oxidizing the silicon substrate after forming the layer STC1 to form additional silicon oxide on the trench's portion overlain by the layer STC1.

15. The method of claim 14 wherein the layer STC1 comprises at least one atomic percent of chlorine.

16. The method of claim 15 wherein the layer STC1 comprises at most 10 atomic percent of chlorine.

17. The method of claim 14 wherein the layer STC1 comprises at least $10^{13}$ chlorine atoms per cm$^2$.

18. The method of claim 17 wherein the layer STC1 comprises at most $10^{14}$ chlorine atoms per cm$^2$.

19. The method of claim 13 further comprising forming a first layer on the substrate and forming an opening in the first layer;
   wherein forming the trench comprises etching the substrate through said opening;
   wherein the first dielectric is formed when the first layer covers a portion of the substrate adjacent to the trench.

20. The method of claim 19 further comprising, after forming the first dielectric:
   removing the first layer from over said portion of the substrate adjacent to the trench;
   forming a gate dielectric on said portion of the substrate adjacent to the trench, wherein forming the gate dielectric comprises oxidizing a top surface of said portion of the substrate adjacent to the trench;
   forming a transistor gate on the gate dielectric.

* * * * *